(12) United States Patent
Capp et al.

(10) Patent No.: US 7,303,820 B2
(45) Date of Patent: Dec. 4, 2007

(54) HEAT SPREADER FOR DISPLAY DEVICE

(75) Inventors: Joseph P. Capp, Strongsville, OH (US); Timothy Clovesko, North Olmsted, OH (US); Julian Norley, Chagrin Falls, OH (US); Martin David Smalc, Parma, OH (US); Bradley E. Reis, Westlake, OH (US)

(73) Assignee: GrafTech International Holdings Inc., Parma, OH (US)

( * ) Notice: Subject to any disclaimer, the term of this patent is extended or adjusted under 35 U.S.C. 154(b) by 316 days.

(21) Appl. No.: 11/045,457

(22) Filed: Jan. 28, 2005

(65) Prior Publication Data

US 2006/0098413 A1    May 11, 2006

(51) Int. Cl.
*B32B 9/00* (2006.01)
(52) U.S. Cl. .................. 428/408; 165/185
(58) Field of Classification Search ........... 428/408; 345/60; 185/165; 423/448
See application file for complete search history.

(56) References Cited

U.S. PATENT DOCUMENTS

| | | | |
|---|---|---|---|
| 1,137,373 A | 4/1915 | Alysworth | |
| 3,404,061 A | 10/1968 | Shane et al. | 161/125 |
| 3,492,197 A | 1/1970 | Olstowski et al. | 161/183 |
| 3,981,427 A | 9/1976 | Brookes | 228/122 |
| 4,355,684 A | 10/1982 | Caines | 165/154 |
| 4,895,713 A | 1/1990 | Greinke et al. | 423/448 |
| 4,914,551 A | 4/1990 | Anschel et al. | 361/389 |
| 5,100,737 A | 3/1992 | Colombier et al. | 428/612 |
| 5,128,209 A | 7/1992 | Sakai et al. | 428/421 |
| 5,482,520 A | 1/1996 | Alam et al. | 44/336 |
| 5,644,327 A | 7/1997 | Onyskevych et al. | 345/80 |
| 5,773,113 A | 6/1998 | Akhter | 428/41.8 |
| 5,831,374 A | 11/1998 | Morita et al. | 313/46 |
| 5,902,762 A | 5/1999 | Mercuri et al. | 501/99 |
| 6,060,166 A | 5/2000 | Hoover et al. | 428/408 |
| 6,075,701 A | 6/2000 | Ali et al. | 361/704 |
| 6,128,209 A | 10/2000 | Kuroki | 365/63 |
| 6,131,651 A | 10/2000 | Richey, III | 165/185 |
| 6,245,400 B1 * | 6/2001 | Tzeng et al. | 428/40.1 |
| 6,407,922 B1 | 6/2002 | Eckblad et al. | 361/704 |
| 6,432,497 B2 | 8/2002 | Bunyan | 428/40.1 |
| 6,482,520 B1 | 11/2002 | Tzeng | 428/408 |
| 6,503,626 B1 | 1/2003 | Norley et al. | 428/408 |

(Continued)

OTHER PUBLICATIONS

Korean Patent Publication No. 10-521475.

(Continued)

*Primary Examiner*—Jennifer C. McNeil
*Assistant Examiner*—Daniel Miller
(74) *Attorney, Agent, or Firm*—James R. Cartiglia; Waddey & Patterson, PC

(57) ABSTRACT

A heat spreader for a display device, such as a plasma display panel, a light emitting diode or a liquid crystal display, which includes at least one sheet of compressed particles of exfoliated graphite having two major surfaces, both of which have a layer of an adhesive thereon.

28 Claims, 2 Drawing Sheets

U.S. PATENT DOCUMENTS

| | | | |
|---|---|---|---|
| 6,538,892 B2 | 3/2003 | Smalc | 361/710 |
| 6,737,790 B2 | 5/2004 | Seki | 313/47 |
| 6,758,263 B2 | 7/2004 | Krassowski et al. | 165/185 |
| 6,835,453 B2 | 12/2004 | Greenwood et al. | 428/343 |
| 6,856,076 B2 | 2/2005 | Kim et al. | 313/46 |
| 2002/0157818 A1 | 10/2002 | Norley et al. | |
| 2002/0163076 A1 | 11/2002 | Tzeng et al. | |
| 2002/0166658 A1 | 11/2002 | Norley et al. | |
| 2004/0257307 A1 | 12/2004 | Bae et al. | |
| 2005/0046618 A1 | 3/2005 | Kim et al. | |
| 2005/0062382 A1 | 3/2005 | Kim et al. | |
| 2005/0068738 A1 | 3/2005 | Kim et al. | |
| 2005/0088097 A1 | 4/2005 | Bae et al. | |
| 2005/0122019 A1 | 6/2005 | Bae | |
| 2005/0174054 A1 | 8/2005 | Kang et al. | |
| 2005/0194900 A1 | 9/2005 | Kim et al. | |

OTHER PUBLICATIONS

Korean Patent Publication No. 10-2001-110652.
Korean Patent Publication No. 10-2005-0019232.
Japan Patent Publication No. 1999-058591.
Japan Patent Publication No. 2003-168882.
Japan Unexamined Patent Publication Hei 10-56114, JP1998056114A, Feb. 24, 1998.
Japan Unexamined Patent Publication Hei 11-179830, JP1999179830A, Jul. 6, 1999.
International Application No. PCT/US02/16730, WO 02/096615.
International Application No. PCT/US02/39749, WO 03/051772.

* cited by examiner

HEAT SPREADER FOR DISPLAY DEVICE

TECHNICAL FIELD

The present invention relates to a heat spreader useful for an display device, such as a plasma display panel (PDP), a liquid crystal display (LCD), a light emitting diode (LED), and the like, and the unique thermal issues occasioned by these devices.

BACKGROUND OF THE ART

A plasma display panel is a display apparatus which contains a plurality of discharge cells, and is constructed to display an image by applying a voltage across electrodes discharge cells thereby causing the desired discharge cell to emit light. A panel unit, which is the main part of the plasma display panel, is fabricated by bonding two glass base plates together in such a manner as to sandwich a plurality of discharge cells between them.

In a plasma display panel, each of the discharge cells which are caused to emit light for image formation generate heat and each thus constitutes a source of heat, which causes the temperature of the plasma display panel as a whole to rise. The heat generated in the discharge cells is transferred to the glass forming the base plates, but heat conduction in directions parallel to the panel face is difficult because of the properties of the glass base plate material.

In addition, the temperature of a discharge cell which has been activated for light emission rises markedly, while the temperature of a discharge cell which has not been activated does not rise as much. Because of this, the panel face temperature of the plasma display panel rises locally in the areas where an image is being generated. Moreover, a discharge cell activated in the white or lighter color spectra generate more heat than those activated in the black or darker color spectra. Thus, the temperature of the panel face differs locally depending on the colors generated in creating the image. These localized temperature differentials can accelerate thermal deterioration of affected discharge cells, unless measures are taken to ameliorate the differences. Additionally, when the nature of the image on the display changes, the location for localized heat generation changes with the image.

Further, since the temperature difference between activated and nonactivated discharge cells can be high, and the temperature difference between discharge cells generating white light and those generating darker colors also can be high, a stress is applied to the panel unit, causing the conventional plasma display panel to be prone to cracks and breakage.

When the voltage to be applied to the electrodes of discharge cells is increased, the brightness of the discharge cells increases but the amount of heat generation in such cells also increases. Thus, those cells having large voltages for activation become more susceptible to thermal deterioration and tend to exacerbate the breakage problem of the panel unit of the plasma display panel. LEDs present similar issues with respect to heat generation as do PDPs. Similar issues arise in display devices other than emissive display devices, such as LCDs, where hot spots can limit the effectiveness or life of the device.

The use of so-called "high orientation graphite film" as thermal interface materials for plasma display panels to fill the space between the back of the panel and a heat sinking unit and to even out local temperature differences is suggested by Morita, Ichiyanagi, Ikeda, Nishiki, Inoue, Komyoji and Kawashima in U.S. Pat. No. 5,831,374, however, no mention of the use or distinct advantages of flexible graphite sheets is made. In addition, U.S. Pat. No. 6,482,520 to Tzeng discloses the use of sheets of compressed particles of exfoliated graphite as heat spreaders (referred to in the patent as thermal interfaces) for a heat source such as an electronic component. Indeed, such materials are commercially available from Advanced Energy Technology Inc. of Lakewood, Ohio as its eGraf® SpreaderShield class of materials.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional such as thermal and electrical conductivity.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material thus produced has excellent flexibility, good strength and a high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cc to about 2.0 g/cc.

The flexible graphite sheet material exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

However, there is a concern in the electronics industries in general that the use of graphite-based materials can result in graphite particles flaking off, with the result that the flakes can mechanically (i.e., in the same manner as dust particles) interfere with equipment operation and function and, more significantly, that due to the conductive nature of graphite, graphite flakes can electrically interfere with operation of the emissive display device. Although it is believed that it has been shown that these concerns are misplaced, they still survive.

Also, the use of adhesives to attach a graphite heat spreader to an emissive display device can be disadvantageous at times. More specifically, in the event rework (i.e., removal and replacement of the heat spreader) is needed, the adhesive bond can be stronger than the structural integrity of the graphite sheet; in this situation, the graphite sheet cannot always be cleanly lifted off the panel without the use of scrapers or other like tools, which can be time consuming and potentially damaging to the graphite sheet, the panel or both.

Another issue which often arises is in attachment of a metallic, such as aluminum, chassis to the display panel, with the heat spreader disposed therebetween. Conventionally, such a chassis is adhered to the panel using a two-sided adhesive tape material which is adhered to the panel about the heat spreader, forming what may be envisioned as a "picture frame" about the heat spreader. Because of this, the adhesion requirements of the tape material are extreme, requiring use of a material which is often not economically efficient.

Thus, what is desired is a light-weight and cost-effective thermal spreader for emissive display devices, to which a metallic structural chassis can be directly adhered, especially a thermal spreader which is isolated to prevent flaking off of graphite particles and which can be effectively removed from the device when needed. The desired spreader should be capable of balancing the temperature differences over the area of the device contacted by the spreader to thereby reduce thermal stresses to which the panel would otherwise be exposed, and to be able to function to reduce hot spots even where the locations of hot spots are not fixed.

SUMMARY OF THE INVENTION

Accordingly, it is an object of the present invention to provide a heat spreader for a display device such as a plasma display panel, a light emitting diode or a liquid crystal display which can be disposed between the rear of the display device and a structural chassis adhered thereto.

Another object of the present invention is to provide a heat spreader material which can be used in a display device to ameliorate the temperature differences which occur during use and which can function to manage heat transfer between the display device and a structural chassis.

Yet another object of the present invention is to provide a heat spreader material to a heat source such as one or more cells of a plasma display panel so that the temperature difference between any two locations on the panel is reduced as compared to a panel without the inventive heat spreader.

Another object of the present invention is to provide a heat spreader material which can be applied between a heat source or collection of heat sources such as a plasma display panel or light emitting diode and a structural chassis, and adhere with good thermal contact between the heat spreader and the display device.

Still another object of the present invention is to provide a heat spreader material which is isolated to prevent or reduce the possibility of graphite particles flaking off.

Yet another object of the present invention is to provide a heat spreader which can adhered and removed from a heat source with minimal damage to the spreader or the source.

A further object of the present invention is to provide a heat spreader which can be produced in sufficient volume and in a cost effective manner.

These objects and others which will be apparent to the skilled artisan upon reading the following description, can be achieved by providing a heat spreader for a display device, comprising at least one sheet of compressed particles of exfoliated graphite having two major surfaces, the major surfaces having a surface area greater than the surface area of that part of the device, such as a discharge cell, facing the back surface of the device. The sheet of compressed particles of exfoliated graphite has a layer of an adhesive material on both major surfaces thereof. The display device can be an emissive display device such as plasma display panel or a light emitting diode panel, or another type of display device such as a liquid crystal display device. More preferably, the at least one sheet of compressed particles of exfoliated graphite has a surface area greater than the surface area of that part of a plurality of discharge cells facing the back surface of the device.

In another embodiment, the heat spreader is a laminate comprising a plurality of sheets of compressed particles of exfoliated graphite; it can also have a protective coating thereon to prevent flaking of graphite particles therefrom. In a preferred embodiment, the surface of the heat spreader has a facing sheet, such as an aluminum or copper sheet thereon, to further seal the heats spreader and facilitate rework.

In a preferred embodiment, the heat spreader has a release material positioned on each major surface such that the adhesive on each major surface is sandwiched between the heat spreader and the release material. The release material and adhesive are selected to permit a predetermined rate of release of the release material without causing undesirable damage to the heat spreader. Indeed, the adhesive and release material provide an average release load of no greater than about 40 grams per centimeter at a release speed of one meter per second, more preferably no greater than about 10 grams per centimeter at a release speed of one meter per second.

Additionally, the adhesive preferably achieves a minimum lap shear adhesion strength of at least about 125 grams per square centimeter, more preferably an average lap shear adhesion strength of at least about 700 grams per square centimeter. The adhesive should result in an increase in through thickness thermal resistance of the adhesive/heat spreader material of not more than about 35% as compared to the heat spreader material itself. The thickness of the adhesive should be no greater than about 0.015 millimeters (mm), more preferably no greater than about 0.005 mm.

It is to be understood that both the foregoing general description and the following detailed description provide embodiments of the invention and are intended to provide an overview or framework of understanding and nature and character of the invention as it is claimed. The accompanying drawings are included to provide a further understanding of the invention and are incorporated in and constitute a part of the specification. The drawings illustrate various embodiments of the invention and together with the description serve to describe the principles and operations of the invention.

DETAILED DESCRIPTION OF THE PREFERRED EMBODIMENT

Figure 1:
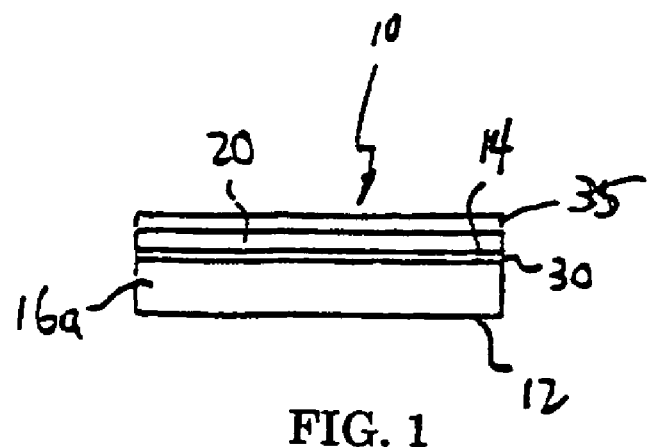
FIG. 1 is a side plan view of an embodiment of the inventive heat spreader.

Graphite is a crystalline form of carbon comprising atoms covalently bonded in flat layered planes with weaker bonds between the planes. In obtaining source materials such as the above flexible sheets of graphite, particles of graphite, such as natural graphite flake, are typically treated with an intercalant of, e.g. a solution of sulfuric and nitric acid, where the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The expanded (otherwise referred to as exfoliated) graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact.

Graphite starting materials for the flexible sheets suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions, and the like. Natural graphite is most preferred.

The graphite starting materials for the flexible sheets used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed.

Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1, 4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalated graphite flake with the organic reducing agent, the blend can be exposed to temperatures in the range of 25° to 125° C. to promote reaction of the reducing agent and intercalated graphite flake. The heating period is up to about 20 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing (or "calendering") graphite worms into flexible graphite sheet. The resulting sheet therefore has higher area weight uniformity and greater tensile strength, even when the starting graphite particles are smaller than conventionally used. The lubricious additive is preferably a long chain hydrocarbon. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compression molded together into flexible sheets having small transverse openings that, unlike the original graphite flakes, can be formed and cut into various shapes, as hereinafter described.

Alternatively, the flexible graphite sheets of the present invention may utilize particles of reground flexible graphite sheets rather than freshly expanded worms. The sheets may be newly formed sheet material, recycled sheet material, scrap sheet material, or any other suitable source.

Also the processes of the present invention may use a blend of virgin materials and recycled materials, or all recycled materials.

The source material for recycled materials may be sheets or trimmed portions of sheets that have been compression molded as described above, or sheets that have been compressed with, for example, pre-calendering rolls. Furthermore, the source material may be sheets or trimmed portions of sheets that have been impregnated with resin, but not yet cured, or sheets or trimmed portions of sheets that have been impregnated with resin and cured. The source material may also be recycled flexible graphite PEM fuel cell components such as flow field plates or electrodes. Each of the various sources of graphite may be used as is or blended with natural graphite flakes.

Once the source material of flexible graphite sheets is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

Once the source material is comminuted, and any resin is removed if desired, it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into flexible sheets, as hereinbefore described.

Flexible graphite sheet and foil are coherent, with good handling strength, and are suitably compressed by, e.g. compression molding, to a thickness of about 0.025 mm to 3.75 mm and a typical density of about 0.1 to 1.5 grams per cubic centimeter (g/cc). Although not always preferred, the flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. When used, a suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, or mixtures thereof. Suitable epoxy resin systems include those based on diglycidyl ether or bisphenol A (DGEBA) and other multifunctional resin systems; phenolic resins that can be employed include resole and novolak phenolics.

Figure 4:
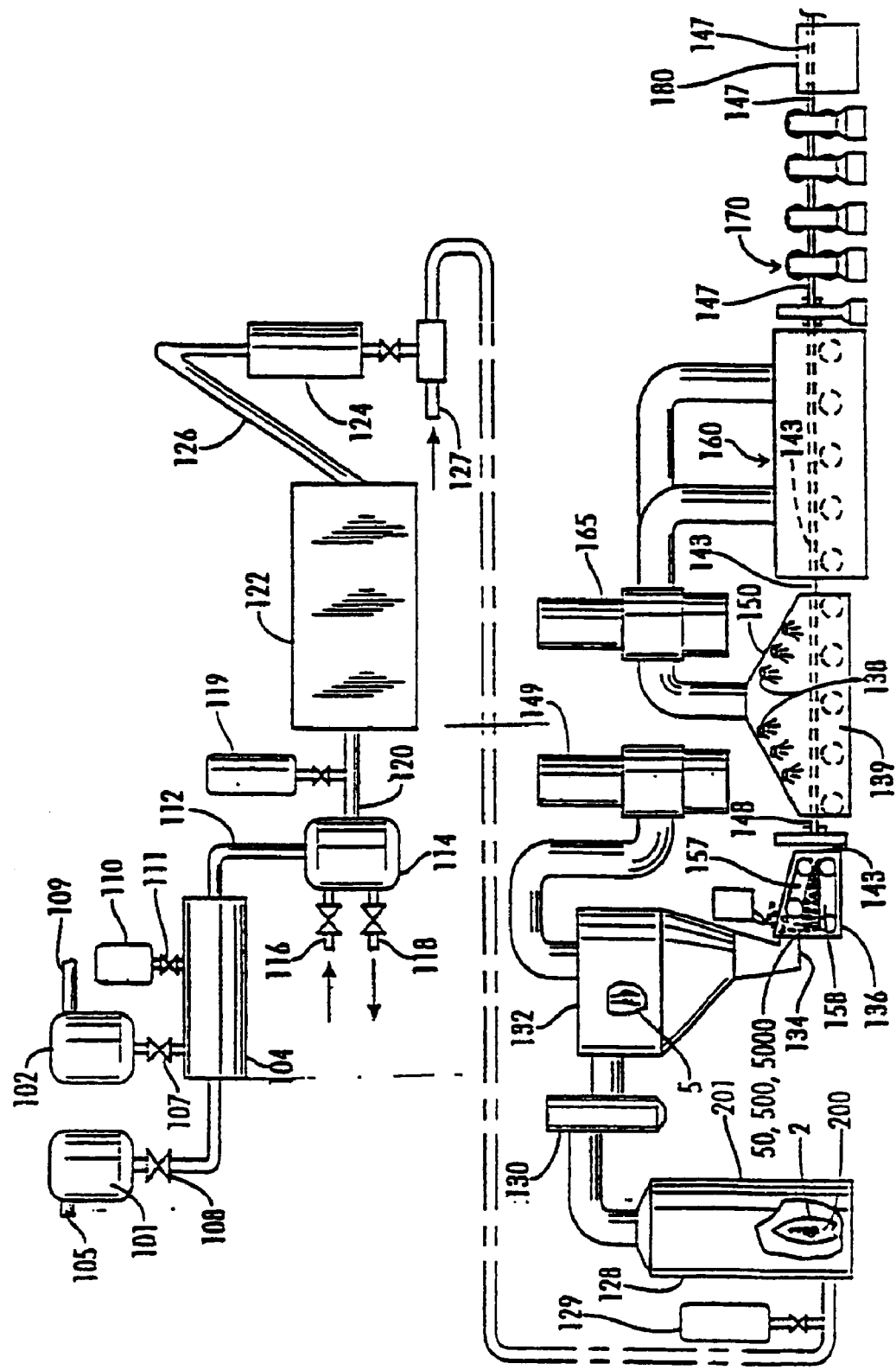
FIG. 4 shows a system for the continuous production of resin-impregnated flexible graphite sheets.

With reference to FIG. 4, a system is disclosed for the continuous production of resin-impregnated flexible graphite sheet, where graphite flakes and a liquid intercalating agent are charged into reactor 104. More particularly, a vessel 101 is provided for containing a liquid intercalating agent. Vessel 101, suitably made of stainless steel, can be continually replenished with liquid intercalant by way of conduit 106. Vessel 102 contains graphite flakes that, together with intercalating agents from vessel 101, are introduced into reactor 104. The respective rates of input into reactor 104 of intercalating agent and graphite flake are controlled, such as by valves 108, 107. Graphite flake in vessel 102 can be continually replenished by way of conduit 109. Additives, such as intercalation enhancers, e.g., trace acids, and organic chemicals may be added by way of dispenser 110 that is metered at its output by valve 111.

The resulting intercalated graphite particles are soggy and acid coated and are conducted (such as via conduit 112) to a wash tank 114 where the particles are washed, advantageously with water which enters and exits wash tank 114 at 116, 118. The washed intercalated graphite flakes are then passed to drying chamber 122 such as through conduit 120. Additives such as buffers, antioxidants, pollution reducing chemicals can be added from vessel 119 to the flow of intercalated graphite flake for the purpose of modifying the surface chemistry of the exfoliate during expansion and use and modifying the gaseous emissions which cause the expansion.

The intercalated graphite flake is dried in dryer 122, preferably at temperatures of about 75° C. to about 150° C., generally avoiding any intumescence or expansion of the intercalated graphite flakes. After drying, the intercalated graphite flakes are fed as a stream into flame 200, by, for instance, being continually fed to collecting vessel 124 by way of conduit 126 and then fed as a stream into flame 200 in expansion vessel 128 as indicated at 2. Additives such as ceramic fiber particles formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like can be added from vessel 129 to the stream of intercalated graphite particles propelled by entrainment in a non-reactive gas introduced at 127.

The intercalated graphite particles 2, upon passage through flame 200 in expansion chamber 201, expand more than 80 times in the "c" direction and assume a "worm-like" expanded form 5; the additives introduced from 129 and blended with the stream of intercalated graphite particles are essentially unaffected by passage through the flame 200. The expanded graphite particles 5 may pass through a gravity separator 130, in which heavy ash natural mineral particles are separated from the expanded graphite particles, and then into a wide topped hopper 132. Separator 130 can be by-passed when not needed.

The expanded, i.e., exfoliated graphite particles 5 fall freely in hopper 132 together with any additives, and are randomly dispersed and passed into compression station 136, such as through trough 134. Compression station 136 comprises opposed, converging, moving porous belts 157, 158 spaced apart to receive the exfoliated, expanded graphite particles 5. Due to the decreasing space between opposed moving belts 157, 158, the exfoliated expanded graphite particles are compressed into a mat of flexible graphite, indicated at 148 having thickness of, e.g., from about 25.4 to 0.075 mm, especially from about 25.4 to 2.5 mm, and a density of from about 0.08 to 2.0 g/cm$^3$. Gas scrubber 149 may be used to remove and clean gases emanating from the expansion chamber 201 and hopper 132.

The mat 148 is passed through vessel 150 and is impregnated with liquid resin from spray nozzles 138, the resin advantageously being "pulled through the mat" by means of vacuum chamber 139 and the resin is thereafter preferably dried in dryer 160 reducing the tack of the resin and the resin impregnated mat 143 is thereafter densified into roll pressed flexible graphite sheet 147 in calender mill 170. Gases and fumes from vessel 150 and dryer 160 are preferably collected and cleaned in scrubber 165.

After densification, the resin in flexible graphite sheet 147 is at least partially cured in curing oven 180. Alternatively, partial cure can be effected prior to densification, although post-densification cure is preferred.

In one embodiment of the invention, however, the flexible graphite sheet is not resin-impregnated, in which case vessel, 150, dryer 160 and curing oven 180 can be eliminated.

Plasma display panels, and other display devices, are now being produced at sizes of 1 meter and above (measured from corner to corner). Thus, heat spreaders used to cool and ameliorate the effects of hot spots on such panels are also required to be relatively large, on the order of about 270 millimeters×about 500 millimeters, or as large as about 800 millimeters×500 millimeters, or even larger. In a plasma display panel, as discussed above, thousands of cells, each containing a plasma gas, are present. When a voltage is applied to each cell, the plasma gas then reacts with phosphors in each cell to produce colored light. Since significant power is required to ionize the gas to produce the plasma, the plasma display can become very hot. Moreover, depending on the color in a particular region of the panel, hot spots can be created on the screen which can result in premature breakdown of the phosphors which can shorten display life as well as cause thermal stresses on the panel itself. Therefore, a heat spreader is needed to reduce the effect of these hot spots.

Sheets of compressed particles of exfoliated graphite, especially laminates of sheets of compressed particles of exfoliated graphite, have been found particularly useful as heat spreaders for display devices such as plasma display panels. More particularly, one or more sheets of compressed particles of exfoliated graphite, referred to herein as sheets of flexible graphite, are placed in thermal contact with the back of a plasma display panel, such that the flexible graphite sheet overlays a plurality of heat sources (i.e., discharge cells) in the panel. In other words, the surface area of the flexible graphite sheet is larger than the surface area of a discharge cell at the back of the plasma display panel; indeed, the surface area of the flexible graphite sheet is larger than the surface area of a plurality of discharge cells at the back of the plasma display panel. Thus, because of the nature of the flexible graphite material from which the inventive heat spreader is formed, it will spread the heat from hot spots which may arise in different locations on the plasma display panel, as the image displayed by the panel changes.

Because of the nature of flexible graphite sheet materials, in that they are more conformable than other materials, even other forms of graphite, the contact resistance between the heat spreader and the plasma display panel is reduced and better thermal contact can be achieved than when using prior art heat spreaders applied with equivalent application pressures.

The flexible graphite sheet heat spreader of the present invention acts to reduce the heat difference (i.e., $\Delta T$) between locations on the display device. In other words, the temperature difference between a hot spot on a plasma display panel, such as a location where a white image is created, and an adjacent location where a darker image is created, is reduced by the use of the inventive flexible graphite heat spreaders, as compared to the $\Delta T$ had the flexible graphite sheet not been present. Therefore, thermal stresses to which the plasma display panel would otherwise have been exposed are reduced, extending panel life and effectiveness. Moreover, since hot spots (i.e. thermal spikes) are reduced, the entire unit can be run at a higher temperature, with resulting image improvement.

In practice, the graphite heat spreaders of the present invention are produced with a layer of adhesive on each major surface thereof; the adhesive on one of the major surfaces is to adhere the heat spreader to the plasma display panel, and the adhesive on the other major surface is to adhere a structural chassis, especially a metallic chassis, to the heat spreader and, thus to the panel. The chassis constitutes the framework to which some or all of the electronic components of the display panel, such as power sources and the like, are mounted, to place the components in an operative relationship with the panel for ease of connection and construction.

With a layer of an adhesive on each major surface of the heat spreader, a release liner must then be used to overlay the adhesive, with the adhesive sandwiched between the release liner and the graphite sheet on each major surface of the sheet, to permit storage and shipping of the graphite heat spreader prior to adhesion of the spreader to the plasma display panel and of the chassis to the spreader.

The use of an adhesive coated graphite sheet (or laminate of sheets) with a release liner has certain requirements which should be met if it is to be practical in a high volume display device manufacturing process. More particularly, the release liner must be capable of being removed from the sheet at high speed without causing delamination of the graphite. Delamination occurs when the release liner in effect pulls the adhesive and some of the graphite off the sheet as it is being removed, resulting in a loss of graphite, impairment of the graphite sheet itself, and diminution of adhesive needed to adhere the graphite sheet to the display device, as well as an unsightly and unfortunate appearance.

With that however, though the adhesive and release liner should be selected to permit release of the release liner from the adhesive/graphite sheet without delamination of the graphite, the adhesive must still be strong enough to maintain the graphite sheet in position on the device while the panel assumes any of a variety of orientations and to ensure good thermal contact between the heat spreader(s) and the device.

In addition, significant diminution of the thermal performance of the heat spreader must not be caused by the adhesive on the major surface which lies against the display panel. In other words, an adhesive applied in a layer that is of substantial thickness can interfere with the thermal performance of the heat spreader, since the adhesive would interfere with the conduction of heat from the plasma display panel or other display device to the heat spreader.

Thus, the adhesive and release liner combination must achieve a balance such that they provide a release load no greater than about 40 g/cm, more preferably about 20 g/cm and most preferably about 10 g/cm, at a release speed of about 1 m/s, as measured, for instance, on a ChemInstruments HSR-1000 high speed release tester. For example, if it is desired to remove the release liner at a speed of about 1 m/s in order to match the high volume manufacturing requirements of a display device like a plasma display panel, the average release load of the release liner should be no greater than about 40 g/cm, more advantageously, about 20 g/cm, and most advantageously about 10 g/cm, in order to permit removal of the release liner without causing graphite delamination at that release speed. To achieve this, the adhesive should preferably be no greater than about 0.015 mm, most preferably no greater than about 0.005 mm, in thickness.

Another factor to be balanced is the adhesion strength of the adhesive which as noted above, should be sufficient to maintain the heat spreader in position on the display device during the manufacturing process and to ensure good thermal contact between the heat spreader and the device. Likewise, the adhesive should be capable of maintaining the structural chassis adhered to the heat spreader (although, since the adhesive can be applied to the entire major surface of the heat spreader to which the chassis is to be adhered, the adhesion strength is less than required by the use of conventional "picture frame" tape materials described above). In order to achieve the required adhesion, the adhesive applied to each of the major surfaces of the graphite heat spreader should have a minimum lap shear adhesion strength of at least about 125 g/cm$^2$, more preferably an average lap shear adhesion strength of at least about 700 g/cm$^2$, as measured, for instance, on a ChemInstruments TT-1000 tensile tester.

With all that, as noted above, the adhesive should not substantially interfere with the thermal performance of the heat spreader. By this is meant, the presence of the adhesive on the major surface which abuts the display panel should not result in an increase in the through-thickness thermal resistance of the heat spreader of more than about 100% as compared to the heat spreader material itself, without adhesive on the major surface abutting the panel. Indeed, in the more preferred embodiment, the adhesive will not lead to an increase in the thermal resistance of more than about 35% as compared to the heat spreader material without adhesive on that major surface.

Thus, the adhesive must meet the release load requirements and average lap shear adhesion strength requirement while being thin enough to avoid an undesirably high increase in thermal resistance. In order to do so, the adhesive on the major surface should be no thicker than about 0.015 mm, more preferably no thicker than about 0.005 mm, on the major surface of the graphite heat spreader which lies against the panel. With respect to the major surface of the heat spreader to which the structural chassis is adhered, if efficient heat transfer from the heat spreader to the chassis is not desired (i.e., if there is no need to employ the chassis as a further heat spreader or as a heat sink), then the adhesive can be thicker than as described, on the order of about 0.05 mm or even thicker. If, however, efficient heat transfer from the heat spreader to the chassis is desired (i.e., if the chassis is used as a further heat spreader or as a heat sink), then the adhesive should be no thicker than about 0.015 mm, more preferably no thicker than about 0.005 mm, on the major surface of the graphite heat spreader on which the structural chassis is adhered.

In order to achieve the balancing described above needed for the production of a heat spreader useful for being applied to a display device like a plasma display panel in a high volume manufacturing process, where the heat spreader is a sheet or laminate of sheets of compressed particles of exfoliated graphite having a thickness no greater than about 2.0 mm and a density between about 1.6 and about 1.9 grams per cubic centimeter, a commercially available pressure sensitive acrylic adhesive in the desired thickness combined with a release liner made of silicone-coated Kraft paper such as an L2 or L4 release liner commercially available from Sil Tech, a division of Technicote Inc., can achieve the desired results. Thus, a heat spreader composite is provided which comprises a heat spreader material such as a sheet or laminate of sheets of compressed particles of exfoliated graphite, having an adhesive on each major surface thereof in a thickness such that the thermal performance of the heat spreader material in transferring heat between the panel and the heat spreader is not substantially compromised, with a release layer positioned such that the adhesive on each major surface is sandwiched between the heat spreader material and release material. In operation then, the release material can be removed from the heat spreader/adhesive combination and the heat spreader material/adhesive combination then applied to a display device such as a plasma display panel such that the adhesive on one of the major surfaces of the spreader adheres the heat spreader material to the plasma display panel. A structural chassis, such as a chassis formed of aluminum or another metal, is adhered to the other major surface of the heat spreader via the adhesive coated thereon.

Furthermore, when a plurality of plasma display panels is being produced, the at least one of the adhesive/heat spreader/adhesive combinations is applied to each of the plurality of plasma display panels and a chassis applied to each adhesive/heat spreader/adhesive combination.

The major surface of the heat spreader to which the chassis is adhered can also have adhered to it a biasing material interposed between the graphite heat spreader and the chassis. The biasing material can be any material which tends to bias the inventive heat spreader against the display panel to thereby reduce contact resistance and increase thermal contact between the heat spreader and the panel, in response to the pressure applied to the biasing material by the structural chassis. In other words, the structural chassis, when adhered to the heat spreader/biasing material combinations, tends to force the heat spreader against the panel for greater thermal contact. The biasing material preferably has the same dimensions as that of the graphite heat spreader. Alternatively, the biasing material can be present in strips or other non-continuous configuration.

Preferred biasing materials comprise compressible and compliant materials such as foams which, when compressed by the action of the chassis forced against them, thereby forcing the heat spreader against the panel as described. Preferably, the materials used are elastic in nature, so as to create an elastic or "spring-like" pressure in the same direction. Advantageously, the foam employed as the biasing material is a rubber or silicone (or filled silicone) foam. The biasing material can be insulating, if efficient heat transfer from the heat spreader to the chassis is not desired or it can have good thermal transfer properties, if efficient heat transfer from the heat spreader to the chassis is desired.

An additional layer of adhesive may be required when the biasing material is employed, such that a layer of adhesive is present between the graphite heat spreader and the biasing material to adhere the biasing material to the heat spreader and a layer of adhesive is present between the biasing material and the chassis to adhere the chassis to the biasing material. That is, there is a layer of adhesive contacting the surface of the biasing material which faces the graphite heat spreader and a layer of adhesive contacting the surface of the biasing material which faces away from the graphite heat spreader. As above, if efficient heat transfer from the heat spreader to the chassis is not desired, then each adhesive layer between the graphite heat spreader and the chassis can be on the order of about 0.05 mm in thickness or even thicker. If, however, efficient heat transfer from the heat spreader to the chassis is desired, then each adhesive layer between the graphite heat spreader and the chassis should be no thicker than about 0.015 mm, more preferably no thicker than about 0.005 mm.

Alternatively, the biasing material can itself be adherent, such that it adheres directly to the graphite heat spreader without the need of an additional layer of adhesive. In addition, when an adherent biasing material is used, the chassis could potentially also be adhered to the biasing material, thus eliminating the need for any adhesive between the graphite heat spreader and the biasing material or between the biasing material and the chassis.

Another alternative embodiment of the invention arises where the structural chassis and/or the electronic components mounted thereon, themselves generate heat. In other words, if the electronic components mounted on the chassis generate heat, the heat generated could potentially be transferred to the panel, either directly from the components through radiation or via the chassis through conduction; this would be undesirable. In this case, a second thermal spreader comprising one or more sheets of compressed particles of exfoliated graphite can be applied so as to be interposed between the biasing material, and adhered by either the layer of adhesive applied to the biasing material or by the adherent nature of the biasing material, and the chassis. The one or more sheets of compressed particles of exfoliated graphite used for this purpose have the same characteristics and materials of construction as the graphite heat spreader material adhered to the panel, and would, of necessity have a layer of an adhesive applied thereto for adhering the chassis to the graphite heat spreader (and thus to the panel). This adhesive layer between the second graphite heat spreader and the chassis should be no thicker than about 0.015 mm, more preferably no thicker than about 0.005 mm.

Thus, this second graphite heat spreader spreads the heat generated by or in the chassis and/or electronic components mounted thereon, to reduce the amount of heat transferred to the panel as well as to substantially reduced hot spots on the panel back caused by heat transfer from the chassis and/or electronic components.

When a flexible graphite laminate is employed as the inventive heat spreader, as opposed to a single, or monolithic, sheet, other laminate layers can also be included, to improve the mechanical or thermal properties of the laminate. For instance, a laminate layer of a thermally conductive metal like aluminum or copper can be interposed between layers of flexible graphite in order to increase the thermal spreading characteristics of the laminate without sacrificing the low contact resistance exhibited by graphite; other materials, such as polymers, can also be employed to reinforce or otherwise improve the strength of the laminate. In addition, the graphite material, whether a single sheet or a laminate, can be provided with a backing layer of, for instance, a thin plastic sheet or, in the alternative, a thin coating of dried resin, to improve handling of the material and/or reduce damage to the sheet during shipment or application to the display device, without compromising the thermal spreading capabilities of the inventive heat spreader. A layer of an insulating material can also be employed.

In addition, the surface of the heat spreader destined to abut the display device can have a facing of a material to improve thermal performance and/or the ability to rework the inventive heat spreader. Most preferred is a metal like aluminum or copper, with aluminum most preferred. Although there may be some thermal sacrifice in terms of greater contact resistance (because the conformable graphite surface is not in contact with the device surface when such a facing is used), that can be made up for by the thermal isotropy of the metallic facing. More to the point, however, since it is the facing which would be adhered to the device surface, removal of the inventive heat spreader for rework or otherwise is facilitated, since the structure of a metal facing would be stronger than the adhesive bond, allowing for quick and non-damaging removal of the heat spreader from the display device surface.

As illustrated in FIG. 1, once formed, the flexible graphite sheet or laminate intended for use as the inventive heat spreader, denoted 10, can be cut into the desired shape, in most cases rectangular. Heat spreader 10 has two major surfaces 12 and 14, as well as at least one edge surface 16, and generally four edge surfaces 16a, 16b, 16c, 16d if spreader 10 is rectangular (as would be apparent, when heat spreader 10 is cut into other than a square shape, such as a round shape or a more complex shape, it will have different numbers of edge surfaces 16).

In accordance with the present invention, and as shown in FIG. 1, a layer of adhesive 30 is provided on major surface 14 of heat spreader 10 to which a structural chassis (not shown) is to be adhered. A biasing material 20 can then be adhered to the adhesive 30, and another adhesive layer 35 then applied to biasing material 20.

Figure 2:
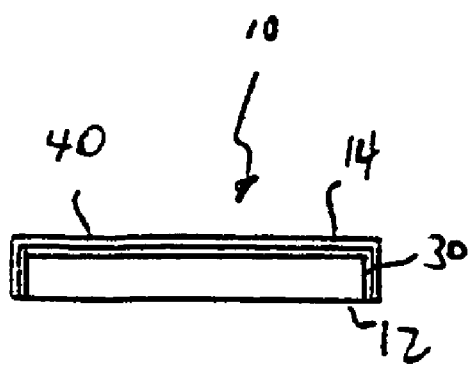
FIG. 2 is a partially-broken away top perspective view of another embodiment of the inventive heat spreader.
Figure 3:
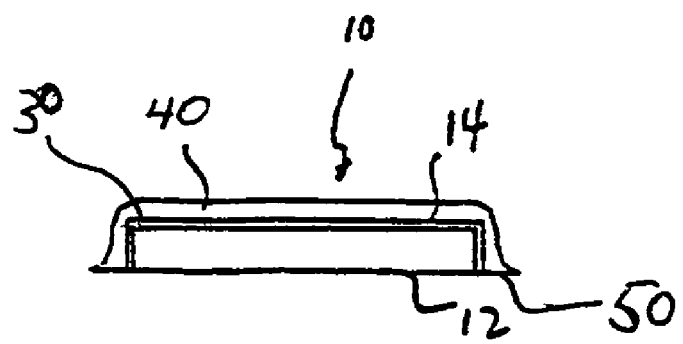
FIG. 3 is a partially-broken away top perspective view of yet another embodiment of the inventive heat spreader.

In alternative embodiment, shown in FIGS. 2 and 3, heat spreader 10 can advantageously also comprise a protective coating 40, to forestall the possibility of graphite particles flaking from, or otherwise being separated from, the flexible graphite sheet or laminate which makes up heat spreader 10, especially if thermal transfer from heat spreader 10 to a structural chassis (not shown) is not desired. Protective coating 40 also advantageously effectively isolates heat spreader 10, to avoid electrical interference engendered by the inclusion of an electrically conductive material (graphite) in an electronic device. Protective coating 40 can comprise any suitable material sufficient to prevent the flaking of the graphite material and/or to electrically isolate the graphite, such as a thermoplastic material like polyethylene, a polyester or a polyimide, a wax and/or a varnish material. Indeed, when grounding is desired, as opposed to electrical isolation, protective coating 40 can comprise a metal such as aluminum.

Advantageously, to achieve the desired flake-resistance and/or electrical isolation, protective coating 40 should preferably be at least about 0.001 mm thick. Although there is no true maximum thickness for protective coating 40, protective coating 40 should be no more than about 0.025 mm thick, preferably no more than about 0.005 mm thick to function effectively.

When heat spreader 10 is applied to the display device like a plasma display panel, major surface 12 of heat spreader 10 is that surface which is in operative contact with the panel. As such, in many applications, the contact between major surface 12 and the panel will function to "seal" major surface 12 against graphite flaking, thus eliminating the need to coat major surface 12 with protective coating 40. Likewise, provided major surface 14 is electrically isolated from the rest of the electrical device in which heat spreader 10 is located, electrically isolating major surface 12 is not necessary. However, for handling or other considerations, in some embodiments protective coating 40 can be coated on both major surfaces 12 and 14 of heat spreader 10 be interposed between the graphite sheet and any adhesive used on major surface 12 for adhering heat spreader 10 to the plasma display panel (not shown).

Heat spreader 10 can be provided with protective coating 40 by several different processes. For instance, once the flexible graphite sheet or laminate is cut to size and shape to form heat spreader 10, the material from which protective coating 40 is formed can be coated on the individual heat spreader 10 so as to flow completely about major surface 14 and edge surface 16, etc. and extend beyond edge surface 16, etc. to form a protective flaking boundary about heat spreader 10, as illustrated in FIG. 3. To that end, protective coating 40 can be applied by various coating methods familiar to the skilled artisan, such as spray coating, roller coating and hot laminating press.

In another alternative embodiment, illustrated in FIG. 2, protective coating 40 can be applied to heat spreader 10 so as to cover one or more edge surfaces 16a, 16b, 16c, 16d (depending, for instance, on which are exposed and thus potentially subject to flaking and/or causing electrical interference). Protective coating 40 can be applied by mechanical mapping and lamination to accomplish this.

In addition, protective coating 40 can also be applied to heat spreader 10 so as to coat major surface 14 only (not shown). One particularly advantageous way of manufacturing this embodiment of heat spreader 10 is to coat a flexible graphite sheet or laminate with protective coating 40, such as by roller coating, laminating with adhesive, or hot press laminating, and then cutting the flexible graphite sheet or laminate into the desired shape of heat spreader 10. In this way, manufacturing efficiency is maximized and waste of protective coating 40 minimized in the manufacturing process.

Generally, the coating process adheres protective coating 40 to heat spreader 10 with sufficient strength for most applications. However, if desired, or for relatively non-adhesive protective coatings 40, such as Mylar® polyester materials and Kapton polyimide materials (both commercially available from E.I. du Pont de Nemours and Company of Wilmington, Del.), a layer of adhesive 30 may be applied between heat spreader 10 and protective coating 40, as illustrated by FIG. 3. Suitable adhesives are those which can facilitate the adhesion of protective coating 40 to heat spreader 10, such as acrylic or latex adhesives. Layer of adhesive 30 can be coated on either or both of heat spreader 10 and protective coating 40. Advantageously, layer of adhesive 30 is as thin as possible while still maintaining adhesion between protective coating 40 and heat spreader 10. Preferably, layer of adhesive 30 is no more than about 0.015 mm in thickness.

In addition, in another embodiment, heat spreader 10 can comprise a facing layer 50 which is interposed between surface 12 of heat spreader 10 and the surface of the display device. As discussed above, facing layer 50 is preferably a metal, such as aluminum, and can be adhered to surface 12 by use of a layer of adhesive 30 applied between surface 12 of heat spreader 10 and facing layer 50, as illustrated by FIG. 3. Suitable adhesives are acrylic or latex adhesives, and can be coated on either or both of heat spreader surface 12 and facing layer 50. Of course, the adhesive 30 is applied as thin as possible while still maintaining adhesion between facing layer 50 and surface 12, preferably no more than about 0.015 mm in thickness.

In addition, as shown in FIG. 3, facing layer 50 can cooperate with protective coating 40 to seal graphite heat spreader 10 between facing layer 50 and protective coating 40. More specifically, if facing layer 50 extends beyond edges 16, etc. of spreader 10, protective coating 40 can be coated about heat spreader 10 and to facing layer 50. Alternatively, a material such as aluminum tape can be employed to seal edges 16 etc. between facing layer 50 and protective coating 40.

Although this application is written in terms of the application of heat spreaders to plasma display panels, it will be recognized that the inventive method and heat spreader are equally applicable to other emissive display device heat sources, or heat source collections (equivalent in relevant function to the collection of individual discharge cells making up the plasma display panel) such as light emitting diodes, as well as other display devices which generate localized higher temperature regions or hot spots, such as liquid crystal displays.

All cited patents and publications referred to in this application are incorporated by reference.

The invention thus being described, it will obvious that it may be varied in many ways. Such variations are not to be regarded as a departure from the spirit and scope of the present invention and all such modifications as would be obvious to one skilled in the art are intended to be included in the scope of the following claims.

What is claimed is:

1. A heat spreader for a display device, comprising at least one sheet of compressed particles of exfoliated graphite having two major surfaces, each of the major surfaces having a layer of an adhesive material thereon, wherein the heat spreader further comprises a biasing material which comprises a foam and which forces the heat spreader against a display device to which the heat spreader is applied in response to pressure applied to the biasing material by the structural chassis of the display device, to increase thermal contact between the heat spreader and the display device.

2. The heat spreader of claim 1 wherein the surface area of one of the major surfaces of the spreader is greater than the surface area of that part of the back surface of a display device where a localized region of higher temperature is generated.

3. The heat spreader of claim 2, wherein the display device is an emissive display device, and the at least one sheet of compressed particles of exfoliated graphite has a surface area greater than the surface area of that part of a discharge cell facing the back surface of the emissive display device.

4. The heat spreader of claim 3 wherein the emissive display device comprises a plasma display panel.

5. The heat spreader of claim 4 wherein the at least one sheet of compressed particles of exfoliated graphite has a surface area greater than the surface area of that part of a plurality of discharge cells facing the back surface of the plasma display panel.

6. The heat spreader of claim 1 wherein the heat spreader comprises a laminate comprising a plurality of sheets of compressed particles of exfoliated graphite.

7. The heat spreader of claim 6 wherein the laminate comprises layers of a non-graphitic material.

8. The heat spreader of claim 1 wherein the heat spreader comprises a release material positioned on each major surface thereof such that the adhesive on each major surface is sandwiched between the at least one sheet of compressed particles of exfoliated graphite and the release material.

9. The heat spreader of claim 8 wherein the adhesive on each major surface thereof achieves a minimum lap shear adhesion strength of at least about 125 grams per square centimeter.

10. The heat spreader of claim 9 wherein the adhesive on each major surface thereof achieves an average lap shear adhesion strength of at least about 700 grams per square centimeter.

11. The heat spreader of claim 10 wherein the thickness of the adhesive on at least one of the major surfaces of the at least one sheet of compressed particles of exfoliated graphite is no greater than about 0.015 mm.

12. The heat spreader of claim 1 wherein at least one of the major surfaces is coated with a protective coating sufficient to inhibit flaking of particles of graphite.

13. A heat spreader for a display device, comprising at least one sheet of compressed particles of exfoliated graphite having two major surfaces, at least one of the major surfaces having a layer of an adhesive material thereon, one of the major surfaces further having a biasing material having two major surfaces adhered thereto such that a first major surface of the biasing material is adhered to the at least one sheet of compressed particles of exfoliated graphite, wherein the biasing material comprises a foam and forces the heat spreader against a display device to which it is applied in response to pressure applied to the biasing material by the structural chassis of the display device, to increase thermal contact between the heat spreader and the display device.

14. The heat spreader of claim 13 wherein the foam comprises a material selected from the group consisting of rubber foams, silicone foams, filled silicone foams, or combinations thereof.

15. The heat spreader of claim 13 which further comprises a layer of adhesive on the surface of the biasing material facing away from the at least one sheet of compressed particles of exfoliated graphite.

16. The heat spreader of claim 13, wherein the display device is an emissive display device, and the at least one sheet of compressed particles of exfoliated graphite has a surface area greater than the surface area of that part of a discharge cell facing the back surface of the emissive display device.

17. The heat spreader of claim 13 wherein the heat spreader comprises a laminate comprising a plurality of sheets of compressed particles of exfoliated graphite.

18. The heat spreader of claim 17 wherein the laminate comprises layers of a non-graphitic material.

19. The heat spreader of claim 13 which further comprises at least one sheet of compressed particles of exfoliated graphite having two major surfaces adhered to the second major surface of the biasing material.

20. The heat spreader of claim 1 wherein the foam comprises a material selected from the group consisting of rubber foams, silicone foams, filled silicone foams, or combinations thereof.

21. The heat spreader of claim 20 which further comprises a layer of adhesive on the surface of the biasing material facing away from the at least one sheet of compressed particles of exfoliated graphite.

22. A display device, comprising:
(a) a display device having a structural chassis;
(b) a heat spreader applied to the display device, wherein the heat spreader comprises at least one sheet of compressed particles of exfoliated graphite having two major surfaces, at least one of the major surfaces having a layer of an adhesive material thereon, one of the major surfaces further having a biasing material having two major surfaces adhered thereto such that a first major surface of the biasing material is adhered to the at least one sheet of compressed particles of exfoliated graphite, wherein the biasing material comprises a foam and forces the heat spreader against the display device in response to pressure applied to the biasing material by the structural chassis, for greater thermal contact.

23. The display device of claim 22 wherein the foam comprises a material selected from the group consisting of rubber foams, silicone foams, filled silicone foams, or combinations thereof.

24. The display device of claim 22 which further comprises a layer of adhesive on the surface of the biasing material facing away from the at least one sheet of compressed particles of exfoliated graphite.

25. The display device of claim 22, wherein the display device is an emissive display device, and the at least one sheet of compressed particles of exfoliated graphite has a surface area greater than the surface area of that part of a discharge cell facing the back surface of the emissive display device.

26. The display device of claim 22 wherein the heat spreader comprises a laminate comprising a plurality of sheets of compressed particles of exfoliated graphite.

27. The display device of claim 26 wherein the laminate comprises layers of a non-graphitic material.

28. The display device of claim 22 which further comprises at least one sheet of compressed particles of exfoliated graphite having two major surfaces adhered to the second major surface of the biasing material.

* * * * *